(12) United States Patent
Chou et al.

(10) Patent No.: US 12,426,283 B2
(45) Date of Patent: Sep. 23, 2025

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Wei-Yu Chou, Taichung (TW);
Yang-Che Chen, Hsin-Chu (TW);
Yi-Lun Yang, Taoyuan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 544 days.

(21) Appl. No.: 17/816,242

(22) Filed: Jul. 29, 2022

(65) Prior Publication Data
US 2024/0038828 A1 Feb. 1, 2024

(51) Int. Cl.
*H10D 1/00* (2025.01)
*H10D 1/20* (2025.01)

(52) U.S. Cl.
CPC ..................... *H10D 1/20* (2025.01)

(58) Field of Classification Search
CPC ..................................................... H10D 1/20
See application file for complete search history.

(56) References Cited

U.S. PATENT DOCUMENTS

2015/0255529 A1* 9/2015 Wang ............... H01L 21/31111
438/3
2021/0098371 A1* 4/2021 Hsu .................... H01L 23/5227

* cited by examiner

Primary Examiner — Wael M Fahmy
Assistant Examiner — Fernando Jose Ramos-Diaz
(74) Attorney, Agent, or Firm — WPAT LAW; Anthony King

(57) ABSTRACT

A semiconductor structure includes a recess extending into a substrate and an inductor device including a first isolation layer, a first magnetic layer over the first isolation layer, a second isolation layer over the first magnetic layer, and a conductive element surrounded by the second isolation layer, wherein at least a portion of the inductor device is disposed within the recess. A method of manufacturing a semiconductor structure includes disposing a first isolation layer on a surface of a substrate and extending into a recess formed on the surface; disposing a first magnetic layer over the first isolation layer; disposing a second isolation layer over the first magnetic layer to form a trench; disposing a conductive element in the trench; disposing a third isolation layer over the first magnetic layer, the conductive element and the second isolation layer; and disposing a second magnetic layer over the third isolation layer.

20 Claims, 22 Drawing Sheets

SEMICONDUCTOR STRUCTURE AND METHOD OF MANUFACTURING THE SAME

BACKGROUND

Semiconductor devices are essential for many modern applications. With the advancement of electronic technology, the semiconductor devices are becoming increasingly smaller in size while having greater functionality and greater amounts of integrated circuitry. Along with such miniaturized scale of the semiconductor devices, an increasing number of semiconductor components are assembled on the semiconductor devices. Furthermore, numerous manufacturing operations are performed upon the small semiconductor device. However, the manufacturing operations of the semiconductor device involve many steps and operations within a small area.

BRIEF DESCRIPTION OF THE DRAWINGS

Aspects of the present disclosure are best understood from the following detailed description when read with the accompanying figures. It should be noted that, in accordance with standard practice in the industry, various structures are not drawn to scale. In fact, dimensions of various structures may be arbitrarily increased or reduced for clarity of discussion.

DETAILED DESCRIPTION

Figure 1:
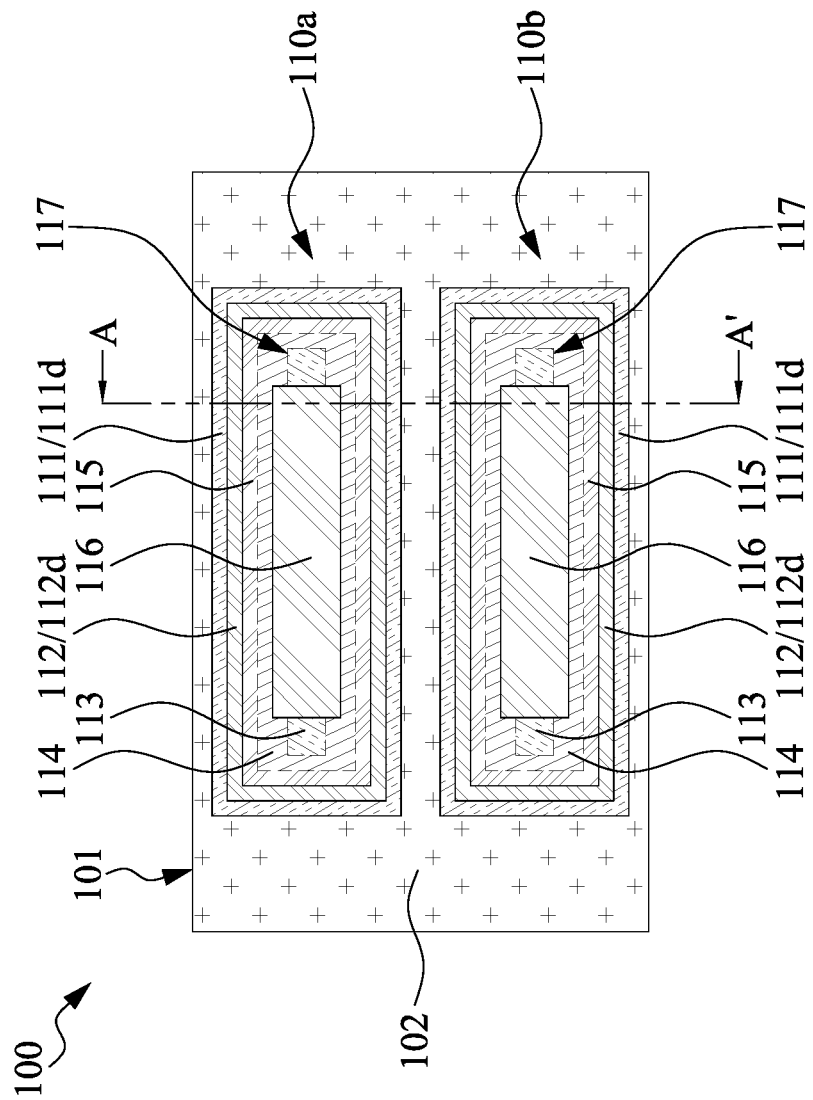
FIG. 1 is a schematic top view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An inductor is a passive electronic component that is used in various electronic applications, such as radio frequency filters, alternating current (AC) blockers, voltage regulators, transformers, and/or the like.

An inductor may be designed with consideration for various parameters of the inductor, such as inductance, magnetic flux, magnetic leakage paths, saturation current, and/or the like. Due to the imprecise nature of some semiconductor processes such as spin coating, some layers or films of an inductor may result in decreased performance of the inductor. For example, an insulating layer of an inductor may be formed by spin coating. The insulating layer may be used for one or more magnetic leakage paths between a lower magnetic layer and an upper magnetic layer of the inductor. However, spin coating may result in layer thickness variations in the insulating layer from inductor to inductor and/or within the same inductor. These layer thickness variations may produce uneven magnetic leakage paths, which may result in inconsistent electrical performance.

In the present disclosure, a semiconductor structure including an inductor device having at least a portion disposed within a recess extending into a substrate from a surface of the substrate is provided. Since the recess is formed before formation of the inductor device within the recess, a configuration of the inductor device is easy to control, and an inductance of the inductor device may be controlled by a layout design. Further, as semiconductor device geometries are reduced, a distance between the inductor device of the present disclosure and a component adjacent to the inductor device may be reduced.

Figure 2:
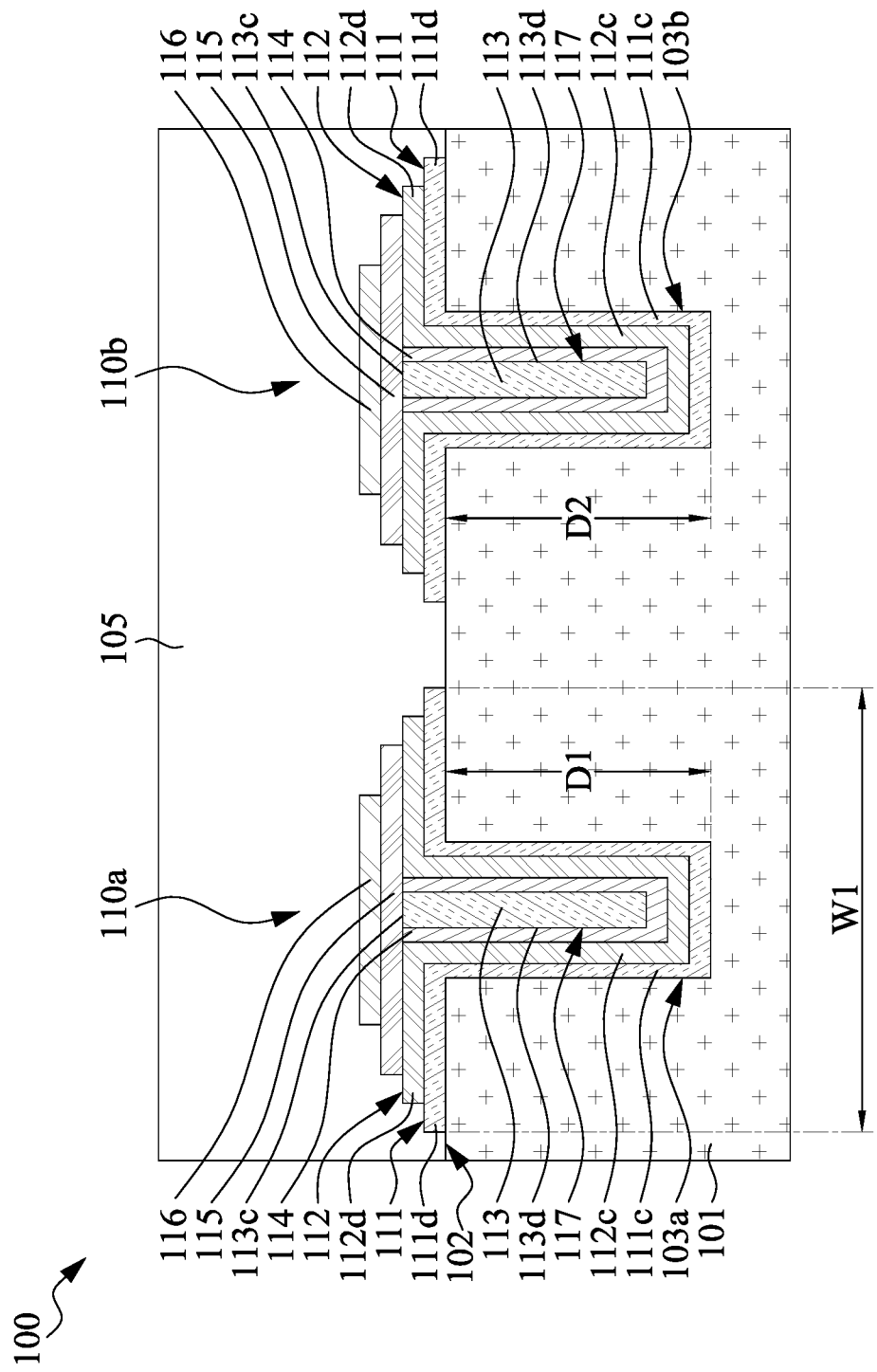
FIG. 2 is a cross-sectional view of the semiconductor structure along line A-A' in FIG. 1.

FIG. 1 is a schematic top view of a semiconductor structure in accordance with some embodiments of the present disclosure. FIG. 2 is a cross-sectional view of the semiconductor structure along line A-A' in FIG. 1. Referring to FIGS. 1 and 2, a semiconductor structure 100 includes a substrate 101 including a surface 102, a first recess 103a extending into the substrate 101 from the surface 102 of the substrate 101, and a first inductor device 110a. At least a portion of the first inductor device 110a is disposed within the first recess 103a. The first inductor device 110a may be and/or include various types of inductive devices, such as an inductor, a coupled inductor, a coupled inductor voltage regulator (CLVR), a transformer, and/or another type of inductive device.

In some embodiments, the semiconductor structure 100 includes a second recess 103b adjacent to the first recess 103a and extending into the substrate 101 from the surface 102 of the substrate 101, and a second inductor device 110b. At least a portion of the second inductor device 110b is disposed within the second recess 103b. The second inductor device 110b may be and/or include various types of inductive devices, such as an inductor, a coupled inductor, a coupled inductor voltage regulator (CLVR), a transformer, and/or another type of inductive device. In some embodiments, the first inductor device 110a and the second inductor device 110b are same as or different from each other in various aspects such as size, dimension, shape, function, circuitry, etc. FIGS. 1 and 2 illustrates only the first inductor device 110a and the second inductor device 110b for clarity and simplicity, but such example is intended to be illustrative only, and is not intended to be limiting to the embodiments. A person ordinarily skilled in the art would readily understand that any suitable number of the inductor devices may alternatively be utilized, and all such combinations are fully intended to be included within the scope of the embodiments. Additionally, while the first inductor device 110a and the second inductor device 110b are illustrated as having similar features, this is intended to be illustrative and is not intended to limit the embodiments, as the first inductor device 110a and the second inductor device 110b may have similar configurations or different configurations in order to meet the desired functional capabilities.

In some embodiments, the substrate 101 is a semiconductor substrate, such as a bulk semiconductor, a semiconductor-on-insulator (SOI) substrate, or the like, and may be doped (e.g., with a p-type or n-type dopant) or undoped. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the substrate 101 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In an embodiment, the substrate 101 is a silicon wafer.

Devices, such as transistors, diodes, capacitors, resistors, etc., may be formed in and/or on the substrate 101 and may be interconnected by metal layers formed by, for example, metallization patterns in one or more dielectric layers on the substrate 101 to form an interconnect layer.

In some embodiments, the first recess 103a is formed by an etching process such as dry etching or wet etching. The dimension, size and shape of the first recess 103a may be adjusted according to requirements, and are not particularly limited. In some embodiments, a depth D1 of the first recess 103a is between 10 and 20 μm. In some embodiments, the second recess 103b is spaced apart from the first recess 103a. In some embodiments, a predetermined distance is between the first recess 103a and the second recess 103b. A depth D2 of the second recess 103b may be similar to or different from the depth D1 of the first recess 103a in order to meet the desired functional requirements. In some embodiments, the first recess 103a and the second recess 103b are same as or different from each other in various aspects such as size, dimension, shape, depth, etc.

In some embodiments, each of the first inductor device 110a and the second inductor device 110b includes a first isolation layer 111, a first magnetic layer 112 over the corresponding first isolation layer 111, a second isolation layer 114 over the corresponding first magnetic layer 112, and a conductive element 113 surrounded by the corresponding second isolation layer 114. In some embodiments, each of the first inductor device 110a and the second inductor device 110b includes a third isolation layer 115 disposed over the corresponding second isolation layer 114 and the corresponding conductive element 113, and a second magnetic layer 116 disposed over the corresponding third isolation layer 115.

In some embodiments, the first isolation layer 111 of the first inductor device 110a is disposed within the first recess 103a and conformal to the first recess 103a, and the first magnetic layer 112 of the first inductor device 110a is conformal to the first isolation layer 111 of the first inductor device 110a. Similarly, in some embodiments, the first isolation layer 111 of the second inductor device 110b is disposed within the second recess 103b and conformal to the second recess 103b, and the first magnetic layer 112 of the second inductor device 110b is conformal to the first isolation layer 111 of the second inductor device 110. In some embodiments, the first isolation layer 111 of the first inductor device 110a is spaced apart from the first isolation layer 111 of the second inductor device 110b. In some embodiments, a predetermined distance is between the first isolation layers 111 of the first inductor device 110a and the second inductor device 110b.

In some embodiments, the first isolation layer 111 includes a main portion 111c and an extension portion 111d. In some embodiments, the main portion 111c of the first isolation layer 111 of the first inductor device 110a is disposed within the first recess 103a, and the extension portion 111*d*, attached to the main portion 111*c*, is disposed on the surface 102 of the substrate 101 and surrounds the first recess 103*a*. In some embodiments, the main portion 111*c* of the first isolation layer 111 of the first inductor device 110*a* is in contact with a bottom wall and a side wall of the first recess 103*a*. In some embodiments, the main portion 111*c* of the first isolation layer 111 is surrounded by the extension portion 111*d*.

Similarly, in some embodiments, the main portion 111*c* of the first isolation layer 111 of the second inductor device 110*b* is disposed within the second recess 103*b*, and the extension portion 111*d*, attached to the main portion 111*c*, is disposed on the surface 102 of the substrate 101 and surrounds the second recess 103*b*. In some embodiments, the main portion 111*c* of the first isolation layer 111 of the second inductor device 110*b* is in contact with a bottom wall and a side wall of the second recess 103*b*. The first isolation layer 111 may be formed of one or more insulating and/or dielectric materials, such as silicon mononitride (SiN), silicon dioxide (SiO), polyimide, benzocyclobutene, and/or the like. The first isolation layer 111 may insulate the corresponding first magnetic layer 112 from the substrate 101.

In some embodiments, the first magnetic layer 112 is disposed over and conformal to the corresponding first isolation layer 111. In some embodiments, the first magnetic layer 112 is attached to the corresponding first isolation layer 111. In some embodiments, the first magnetic layer 112 of the first inductor device 110*a* is spaced apart from the first magnetic layer 112 of the second inductor device 110*b*. In some embodiments, a predetermined distance is between the first magnetic layers 112 of the first inductor device 110*a* and the second inductor device 110*b*.

In some embodiments, a main portion 112*c* of the first magnetic layer 112 is surrounded by the corresponding main portion 111*c* of the corresponding first isolation layer 111, and an extension portion 112*d* of the first magnetic layer 112 is disposed on the corresponding extension portion 111*d* of the corresponding first isolation layer 111. In some embodiments, a portion of the main portion 112*c* of the first magnetic layer 112 of the first inductor device 110*a* is surrounded by the first recess 103*a*. Similarly, in some embodiments, a portion of the main portion 112*c* of the first magnetic layer 112 of the second inductor device 110*b* is surrounded by the second recess 103*b*. In some embodiments, the portion of the extension portion 111*d* of the first isolation layer 111 is exposed by the corresponding extension portion 112*d* of the corresponding first magnetic layer 112. The first magnetic layer 112 may be formed of one or more magnetic materials, such as a cobalt alloy (e.g., cobalt-zirconium-tantalum (CoZrTa) and/or the like), a nickel alloy (e.g., nickel-iron (NiFe) and/or the like), and/or another magnetic material.

In some embodiments, the second isolation layer 114 is disposed over the corresponding first magnetic layer 112 and forms a trench 117. In some embodiments, the second isolation layer 114 is over the corresponding main portion 112*c* of the corresponding first magnetic layer 112. In some embodiments, at least a portion of the second isolation layer 114 of the first inductor device 110*a* is disposed within the first recess 103*a*, and at least a portion of the second isolation layer 114 of the second inductor device 110*b* is disposed within the second recess 103*b*. In some embodiments, the second isolation layer 114 is level with the corresponding extension portion 112*d* of the corresponding first magnetic layer 112. In some embodiments, at least a portion of the trench 117 of the first inductor device 110*a* is conformal to the first recess 103*a*, and at least a portion of the second isolation layer 114 of the second inductor device 110*b* is conformal to the second recess 103*b*.

Each of the second isolation layers 114 may be formed of one or more insulating and/or dielectric materials, such as silicon mononitride (SiN), silicon dioxide (SiO), polyimide, benzocyclobutene, and/or the like. The second isolation layer 114 may insulate the corresponding first magnetic layer 112 from the corresponding conductive element 113.

In some embodiments, the conductive element 113 is surrounded by the second isolation layer 114. In some embodiments, at least a portion of the conductive element 113 of the first inductor device 110*a* is disposed within the first recess 103*a*. In some embodiments, at least a portion of the conductive element 113 of the second inductor device 110*b* is disposed within the second recess 103*b*. In some embodiments, the conductive element 113 is disposed within the corresponding trench 117. In some embodiments, the second isolation layer 114 is disposed between the corresponding conductive element 113 and the corresponding first magnetic layer 112. In some embodiments, a top surface 113*c* of the conductive element 113 is level with the corresponding extension portion 112*d* of the corresponding first magnetic layer 112. In some embodiments, the top surface 113*c* of the conductive element 113 is level with the corresponding second isolation layer 114. In some embodiments, a sidewall 113*d* of the conductive element 113 is surrounded by the corresponding second isolation layer 114. In some embodiments, the sidewall 113*d* of the conductive element 113 is in contact with the corresponding second isolation layer 114. Each of the conductive elements 113 may include one or more conductive traces, conductive wires, and/or other conductive members. Each of the conductive elements 113 may be formed of one or more conductive materials, such as copper, gold, silver, and/or the like.

In some embodiments, the third isolation layer 115 covers the corresponding conductive element 113 and the corresponding second isolation layer 114. In some embodiments, the third isolation layer 115 is in contact with the corresponding top surface 113*c* of the corresponding conductive element 113 and the corresponding second isolation layer 114. In some embodiments, the third isolation layer 115 is disposed over and in contact with at least a portion of the corresponding first magnetic layer 112. In some embodiments, the third isolation layer 115 is disposed over the corresponding main portion 112*c* of the corresponding first magnetic layer 112 and at least a portion of the corresponding extension portion 112*d* of the corresponding first magnetic layer 112. In some embodiments, a portion of the extension portion 112*d* of the corresponding first magnetic layer 112 is exposed by the corresponding third isolation layer 115. In some embodiments, the third isolation layer 115 is disposed over the corresponding trench 117, and the corresponding first recess 103*a* or the corresponding second recess 103*b*. Each of the third isolation layers 115 may be formed of one or more insulating and/or dielectric materials, such as silicon mononitride (SiN), silicon dioxide (SiO), polyimide, benzocyclobutene, and/or the like. The third isolation layer 115 may insulate the corresponding conductive element 113. The first isolation layer 111, the second isolation layer 114 and the third isolation layer 115 may include similar or different insulating and/or dielectric materials.

In some embodiments, the second magnetic layer 116 is disposed over the corresponding third isolation layer 115. In some embodiments, the third isolation layer 115 and the corresponding second magnetic layer 116 are stacked and disposed over the substrate 101. In some embodiments, the third isolation layer 115 and the corresponding second magnetic layer 116 of the first inductor device 110a are stacked and disposed over the first recess 103a. In some embodiments, the third isolation layer 115 and the corresponding second magnetic layer 116 of the second inductor device 110b are stacked and disposed over the second recess 103b. In some embodiments, a portion of the third isolation layer 115 is exposed by the corresponding second magnetic layer 116. Each of the second magnetic layers 116 may be formed of one or more magnetic materials, such as a cobalt alloy (e.g., cobalt-zirconium-tantalum (CoZrTa) and/or the like), a nickel alloy (e.g., nickel-iron (NiFe) and/or the like), and/or another magnetic material. The first magnetic layers 112 and the second magnetic layers 116 may include similar or different magnetic materials.

In some embodiments, the first isolation layer 111, the first magnetic layer 112, the third isolation layer 115, and the second magnetic layer 116 of the first inductor device 110a form a step structure over the substrate 101. Similarly, in some embodiments, the first isolation layer 111, the first magnetic layer 112, the third isolation layer 115, and the second magnetic layer 116 of the second inductor device 110b form a step structure over the substrate 101.

In some embodiments, a dielectric layer 105 is disposed over the first inductor device 110a, the second inductor device 110b and the substrate 101. In some embodiments, the dielectric layer 105 surrounds the extension portion 111d of the first isolation layer 111, the extension portion 112d of the first magnetic layer 112, the third isolation layer 115 and the second magnetic layer 116.

Figure 3:
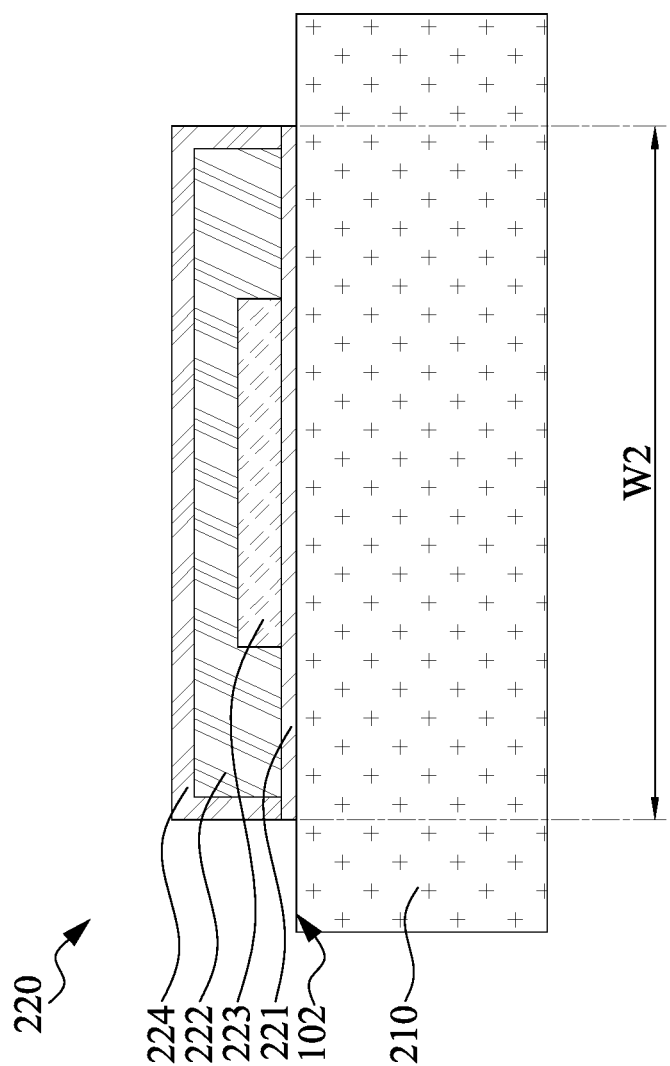
FIG. 3 is a schematic cross-sectional view of a semiconductor structure in accordance with some comparative embodiments.

FIG. 3 is a schematic diagram of a comparative embodiment. In some comparative embodiments, an inductor device 220 is disposed on a surface 211 of a substrate 210. The inductor device 220 includes at least one conductive element 223 disposed on a lower magnetic layer 221, an isolation layer 222 over the lower magnetic layer 221 and surrounding the conductive element 223, and an upper magnetic layer 224 surrounding the isolation layer 222 and in contact with a periphery of the lower magnetic layer 221. In some comparative embodiments, the inductor device 220 includes two or more conductive elements 223, which may correspond to an input of the inductor device 220 (e.g., Vin) and an output from the inductor device 220 (e.g., Vout). In some comparative embodiments, the cross-section of the inductor device 220 is a trapezoid.

Comparing the semiconductor device 100 including the first inductor device 110a of the present disclosure to the inductor device 220, a width W1 of the first inductor device 110a is reduced by 53% from a width W2 of the inductor device 220, and an inductance of the first inductor device 110a is 12.5% greater than that of the inductor device 220. As such, the inductance per area of the first inductor device 110a is 2.12 times that of the inductor device 220.

Figure 4:
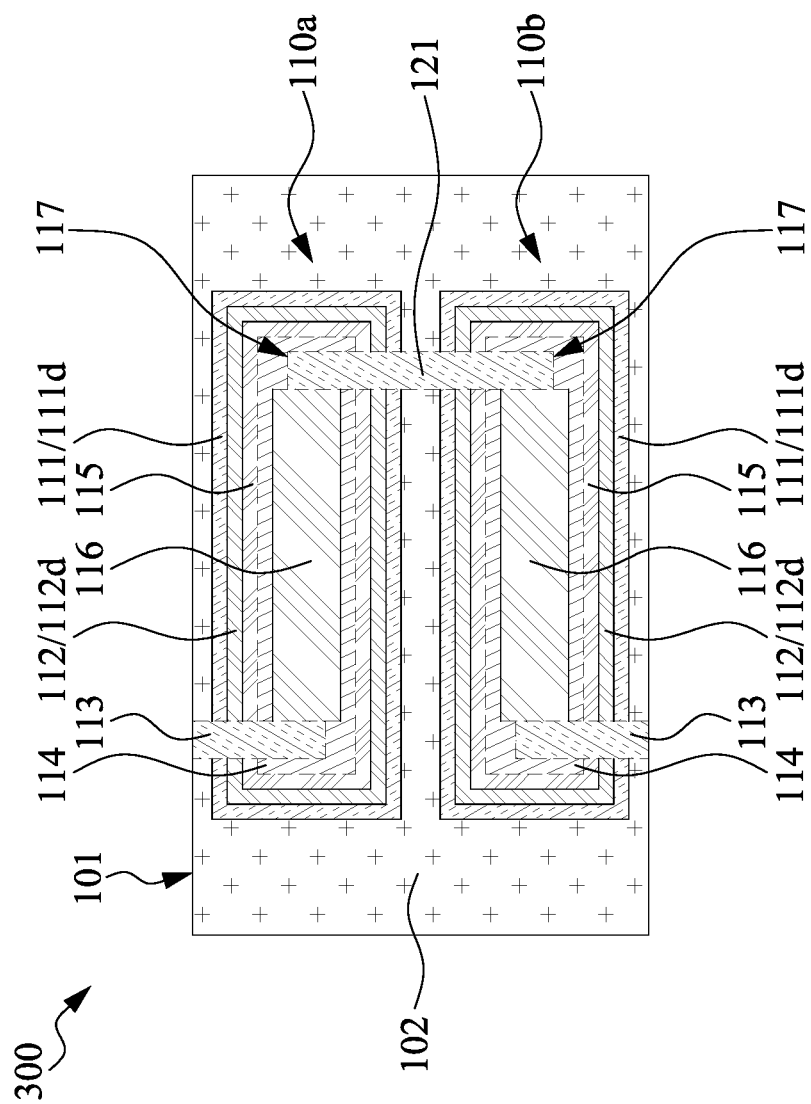
FIGS. 4 and 5 are top views of a semiconductor structure in accordance with some embodiments of the present disclosure.

FIG. 4 is a schematic top view of a semiconductor structure 300 in accordance with some embodiments of the present disclosure. In some embodiments, referring to FIG. 4, the first inductor device 110a and the second inductor device 110b are connected in series. In some embodiments, the semiconductor structure 300 includes the first inductor device 110a, the second inductor device 110b, and a bridging member 121 disposed between and electrically connected to the first inductor device 110a and the second inductor device 110b. In some embodiments, the bridging member 121 couples the conductive element 113 of the first inductor device 110a to the conductive element 113 of the second inductor device 110b. In some embodiments, the bridging member 121 is at least partially covered by a third isolation layer 115 of the first inductor device 110a and the second inductor device 110b.

Figure 5:
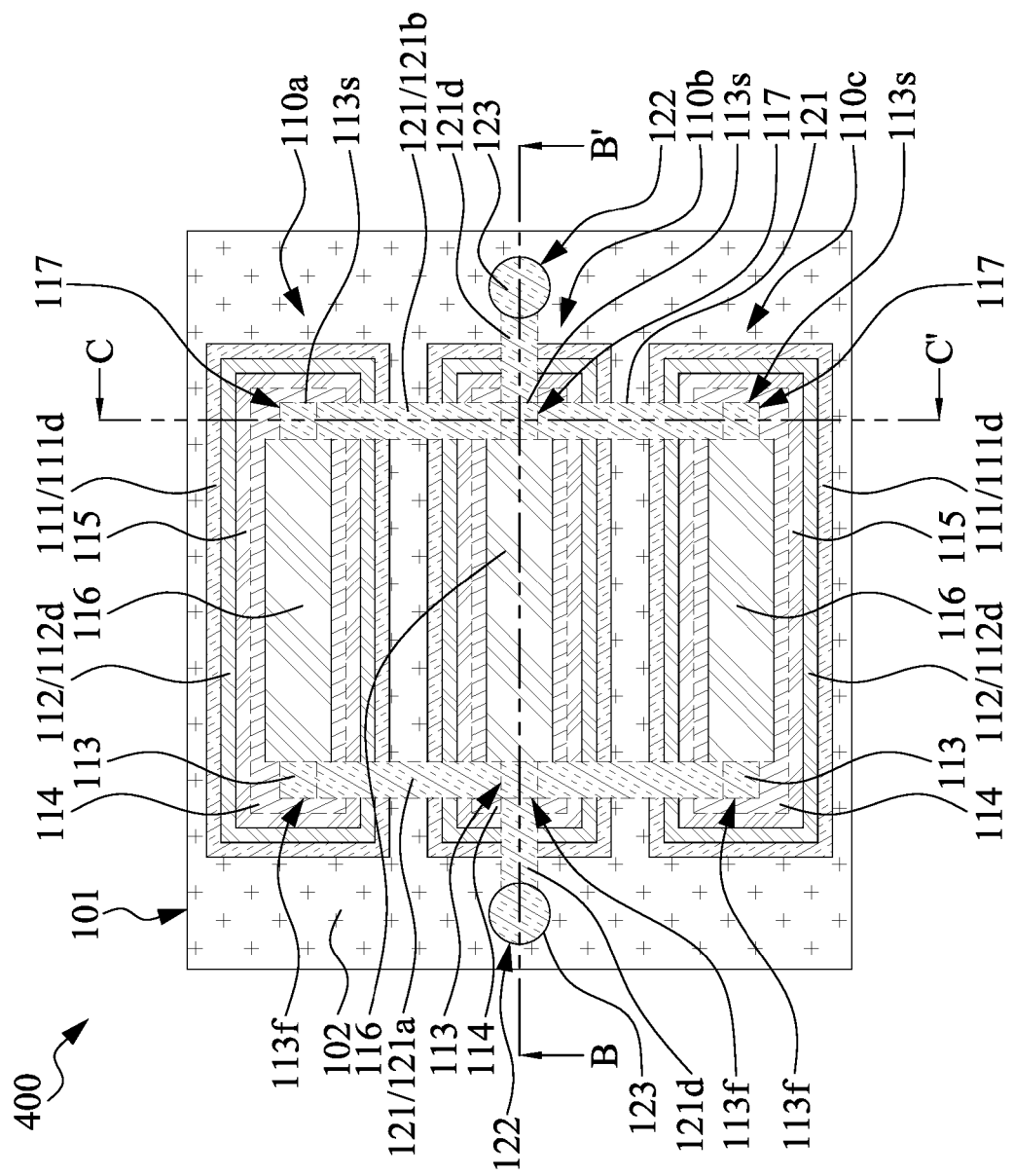
Figure 6:
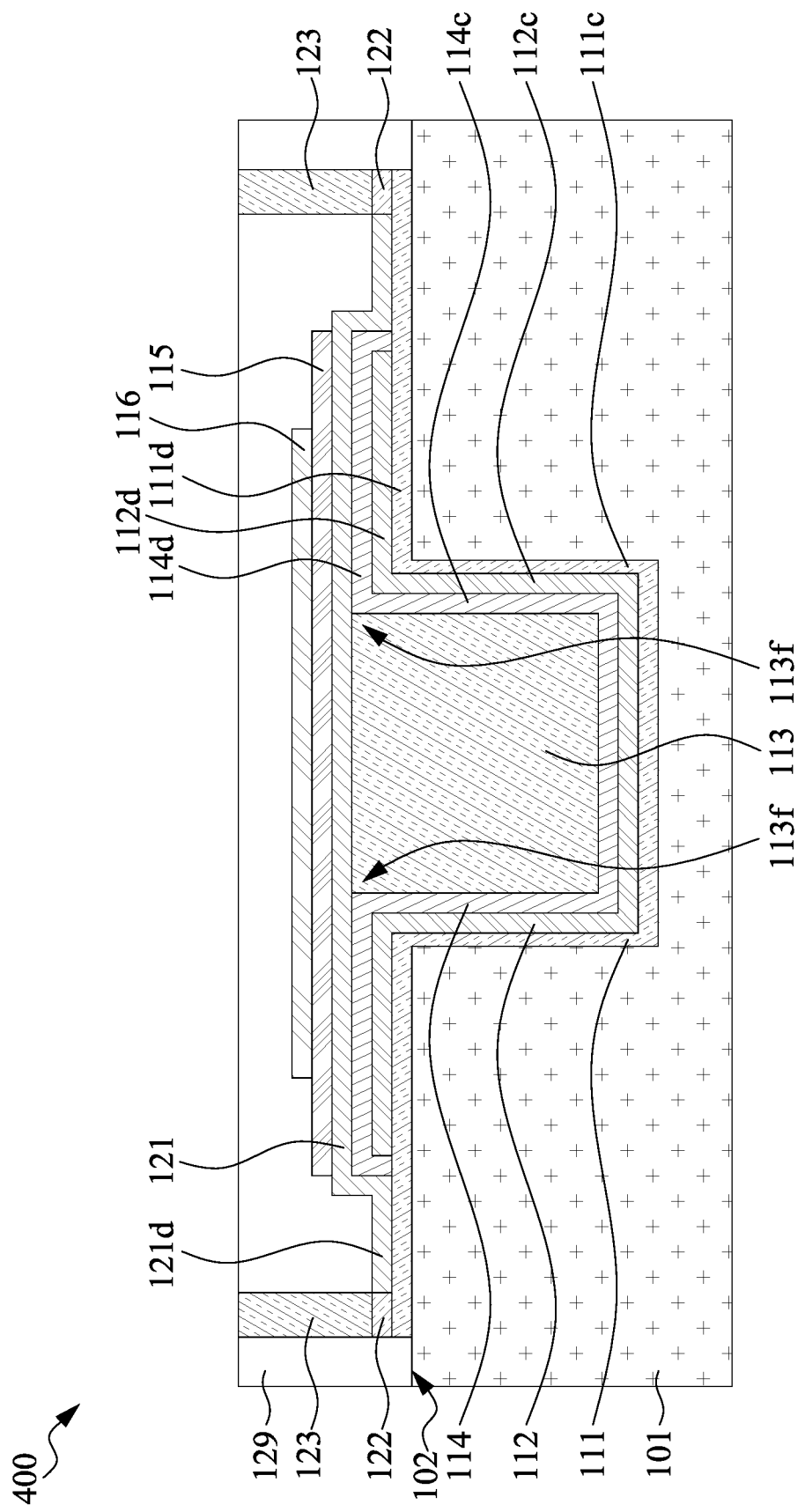
FIGS. 6 and 7 are schematic cross-sectional views of a semiconductor structure in accordance with some embodiments of the present disclosure.
Figure 7:
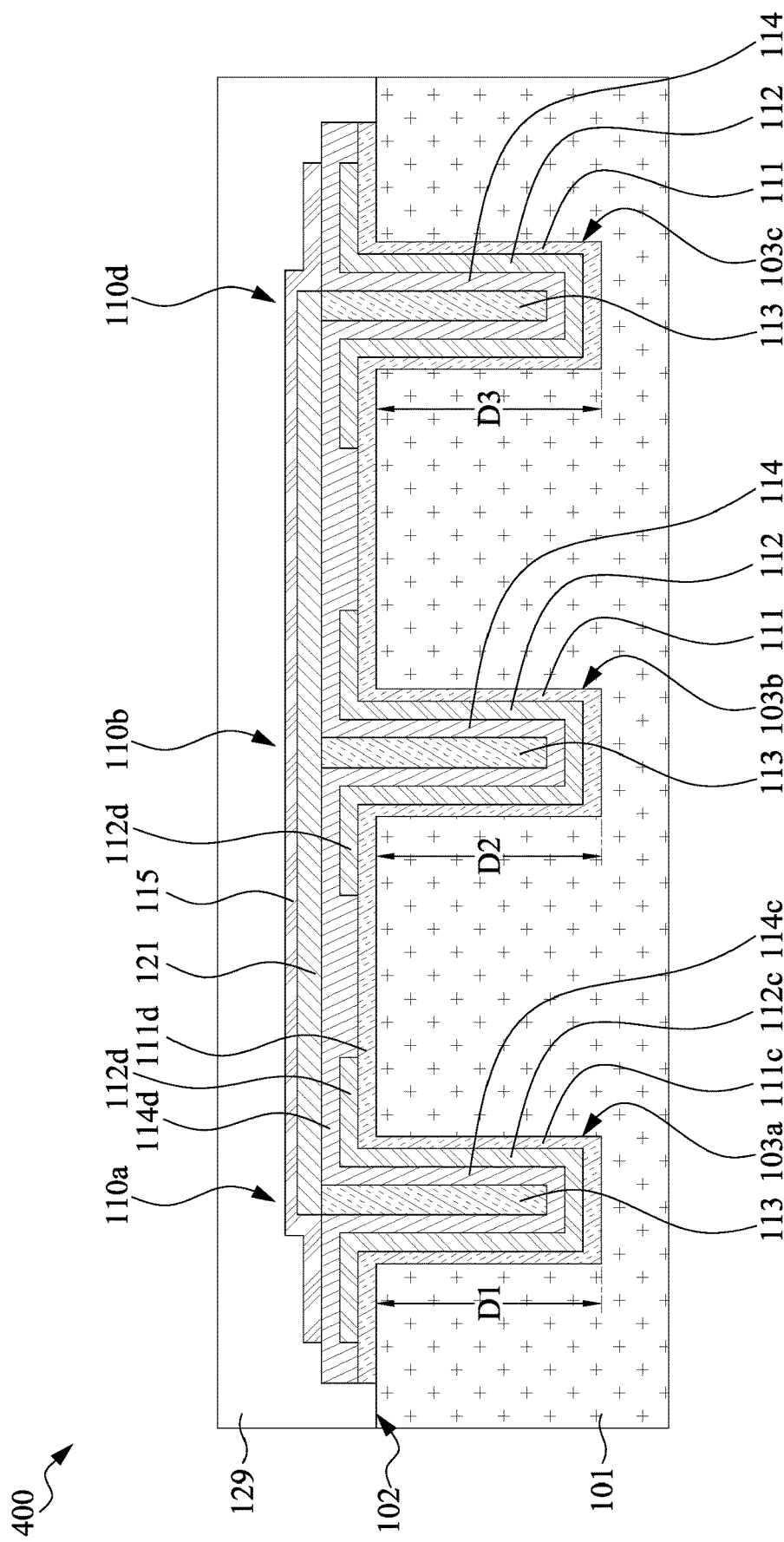

FIG. 5 is a schematic top view of a semiconductor structure 400 in accordance with some embodiments of the present disclosure. FIG. 6 is a cross-sectional view of the semiconductor structure along line B-B' in FIG. 5. FIG. 7 is a cross-sectional view of the semiconductor structure along line C-C' in FIG. 5. In some embodiments, referring to FIGS. 5 to 7, the first inductor device 110a and the second inductor device 110b are connected in parallel. In some embodiments, the semiconductor structure 400 further includes a third inductor device 110c similar to the first inductor device 110a or the second inductor device 110b. In some embodiments, the first inductor device 110a, the second inductor device 110b and the third inductor device 110c are connected in parallel.

In some embodiments, a bridging member 121 is disposed between and electrically connected to the first inductor device 110a, the second inductor device 110b and the third inductor device 110c. In some embodiments, the bridging member 121 couples the conductive elements 113 of the first inductor device 110a, the second inductor device 110b and the third inductor device 110c. In some embodiments, each of the conductive elements 113 is in the shape of a strip and has a first end 113f and a second end 113s opposite to the first end 113f from a top view perspective. In some embodiments, a first bridging member 121a couples the first ends 113f of each of the conductive elements 113, and a second bridging member 121b couples the second ends 113s of each of the conductive elements 113. In some embodiments, the bridging member 121 is at least partially covered by a third isolation layer 115 of the first inductor device 110a, the second inductor device 110b and the third inductor device 110c. In some embodiments, at least a portion of the bridging member 121 is disposed between the conductive elements 113 and the third isolation layer 115.

In some embodiments, the second isolation layer 114 includes a main portion 114c surrounding the corresponding conductive element 113 and an extension portion 114d disposed under the bridging member 121. In some embodiments, the extension portion 114d of the second isolation layer 114 is disposed on the extension portion 112d of the first magnetic layer 112. In some embodiments, the extension portion 114d of the second isolation layer 114 disposed under the bridging member 121 extends from the main portion 114c of the corresponding second isolation layer 114 to the corresponding extension portion 111d of the first isolation layer 111, such that the extension portion 114d of the second isolation layer 114 is in contact with the corresponding extension portion 111d of the first isolation layer 111. In some embodiments, the bridging member 121 is disposed between the extension portions 114d of the second isolation layers 114 of the first inductor device 110a, the second inductor device 110b and the third inductor device 110c and the third isolation layers 115 of the first inductor device 110a, the second inductor device 110b and the third inductor device 110c. In some embodiments, the extension portions 111d of the first isolation layers 111 of the first inductor device 110a, the second inductor device 110b and the third inductor device 110c are continuous. In some embodiments, the extension portions 114d of the second isolation layers 114 of the first inductor device 110a, the second inductor device 110b and the third inductor device 110c are continuous.

In some embodiments, an extension portion 121d of the bridging member 121 is exposed by the third isolation layer 115 of the second inductor device 110b and disposed on the extension portion 111d of the first isolation layer 111 of the second inductor device 110b. In some embodiments, the extension portion 121d of the bridging member 121 electrically connects the conductive members 113 to a bump pad 122. In some embodiments, the bump pad 122 is disposed adjacent to the first inductor device 110a, the second inductor device or the third inductor device 110c and is electrically coupled to the bridging member 121.

In some embodiments, a dielectric layer 129 is disposed over the extension portion 121d of the bridging member 121, the first inductor device 110a, the second inductor device 110b and the third inductor device 110c. In some embodiments, the dielectric layer 129 is an inter-layer dielectric (ILD), such as silicon oxide, borophosphosilicate glass (BPSG), phosphosilicate glass (PSG), fluorinated silicate glass (FSG), carbon-doped silicon oxide, or the like. In some embodiments, a contact 123 is disposed on and electrically connected to the conductive pad 122. In some embodiments, the contact 123 is surrounded by the dielectric layer 129.

Figure 8:
FIG. 8 is a flowchart showing various steps of a method for manufacturing a semiconductor structure in accordance with some embodiments of the present disclosure.

FIG. 8 is a flowchart showing a method 500 of manufacturing a semiconductor structure in accordance with some embodiments of the present disclosure. The method 500 includes several operations: (501) forming a recess on a surface of a substrate; (502) disposing a first isolation layer on the surface and extending into the recess; (503) disposing a first magnetic layer over the first isolation layer; (504) disposing a second isolation layer over the first magnetic layer to form a trench defined by the second isolation layer; (505) disposing a conductive element in the trench; (506) disposing a third isolation layer over the first magnetic layer, the conductive element and the second isolation layer; and (507) disposing a second magnetic layer over the third isolation layer.

Figure 9A:
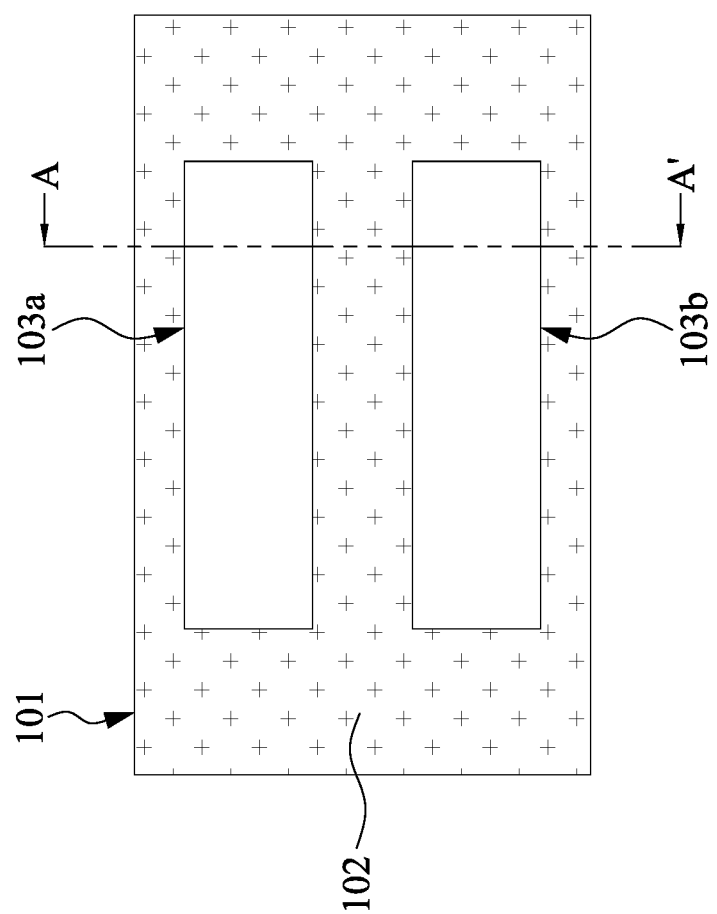
FIGS. 9A, 10A, 11A, 12A, 13A, 14A and 15A are top views of one or more operations of the method for manufacturing a semiconductor structure in accordance with some embodiments of the present disclosure.
Figure 9B:
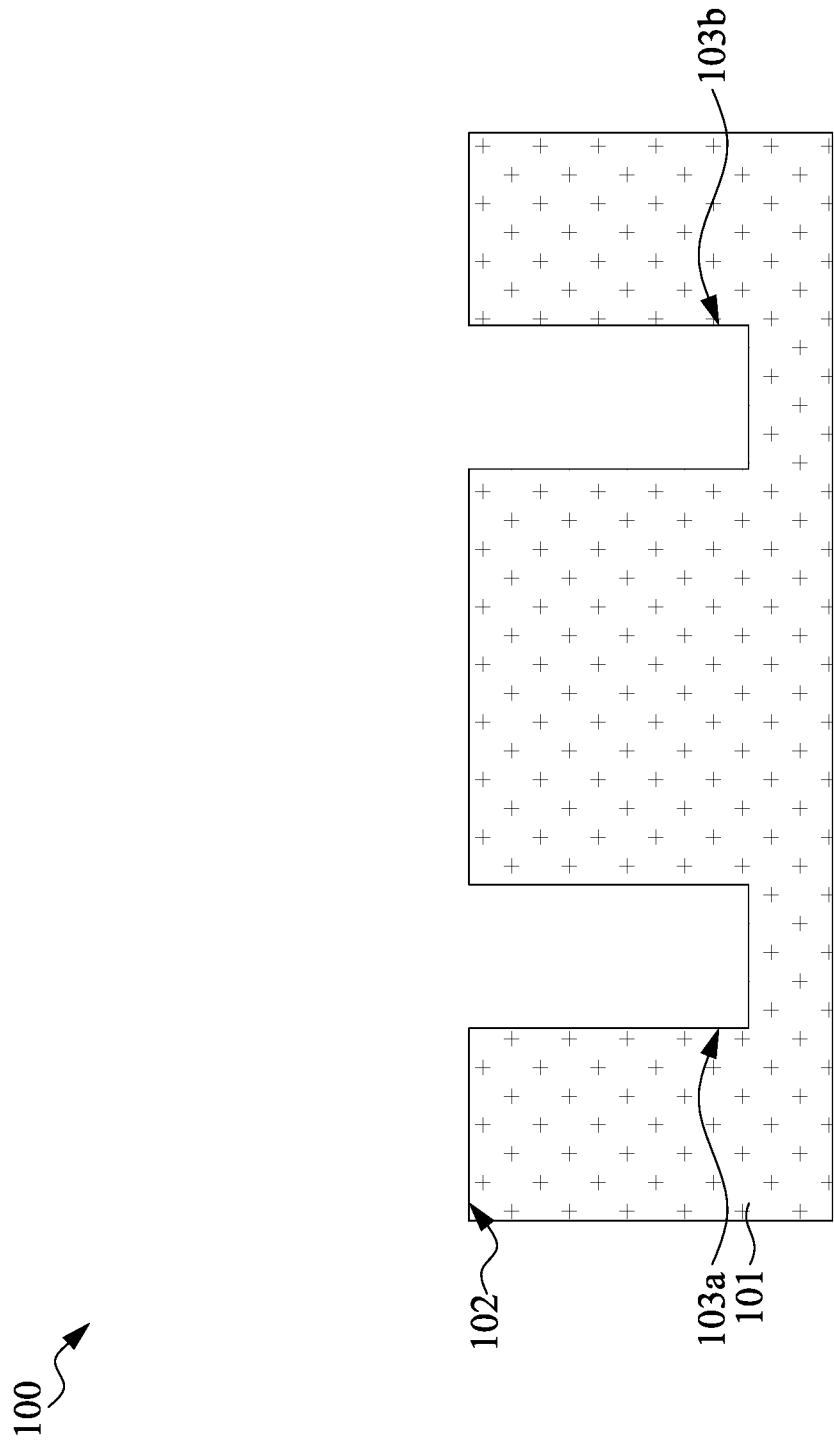
FIGS. 9B, 10B, 11B, 12B, 13B, 14B and 15B are top views of one or more operations of the method for manufacturing a semiconductor structure in accordance with some embodiments of the present disclosure.

FIGS. 9A, 10A, 11A, 12A, 13A, 14A and 15A are top views of one or more operations of the method for manufacturing a semiconductor structure in accordance with some embodiments of the present disclosure. FIG. 9B illustrates a cross-sectional view of the semiconductor structure along line A-A' in FIG. 9A. In operation 501, referring to FIGS. 9A and 9B, a recess (a first recess 103a or a second recess 103b) is formed on a surface 102 of a substrate 101. In some embodiments, the substrate 101 has a configuration similar to those described above or illustrated in any one of FIGS. 1 to 7. In some embodiments, FIGS. 9A and 9B illustrate the formation of the first recess 103a and the second recess 103b adjacent to and separate from the first recess 103a. The first recess 103a and the second recess 103b may be formed by an etching process. The etching process may be performed using acceptable photolithography techniques. In some embodiments, the first recess 103a is substantially same as or different from the second recess 103b. In some embodiments, the first recess 103a and the second recess 103b are formed simultaneously or separately. In some embodiments, the first recess 103a and the second recess 103b have configurations similar to those described above or illustrated in any one of FIGS. 1 to 7.

Figure 10A:
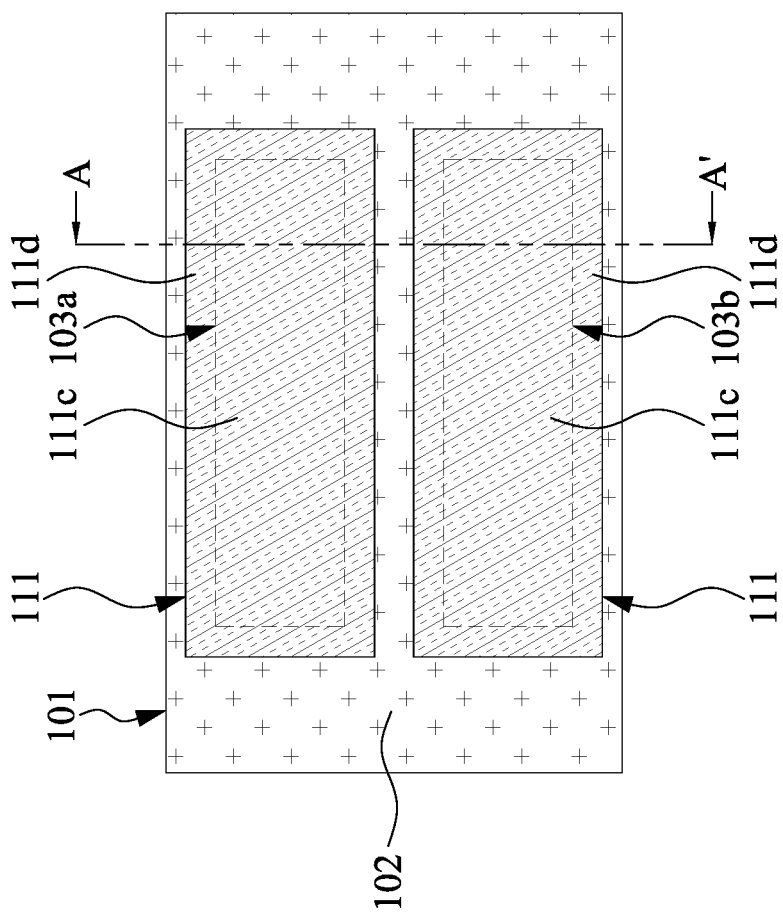
Figure 10B:
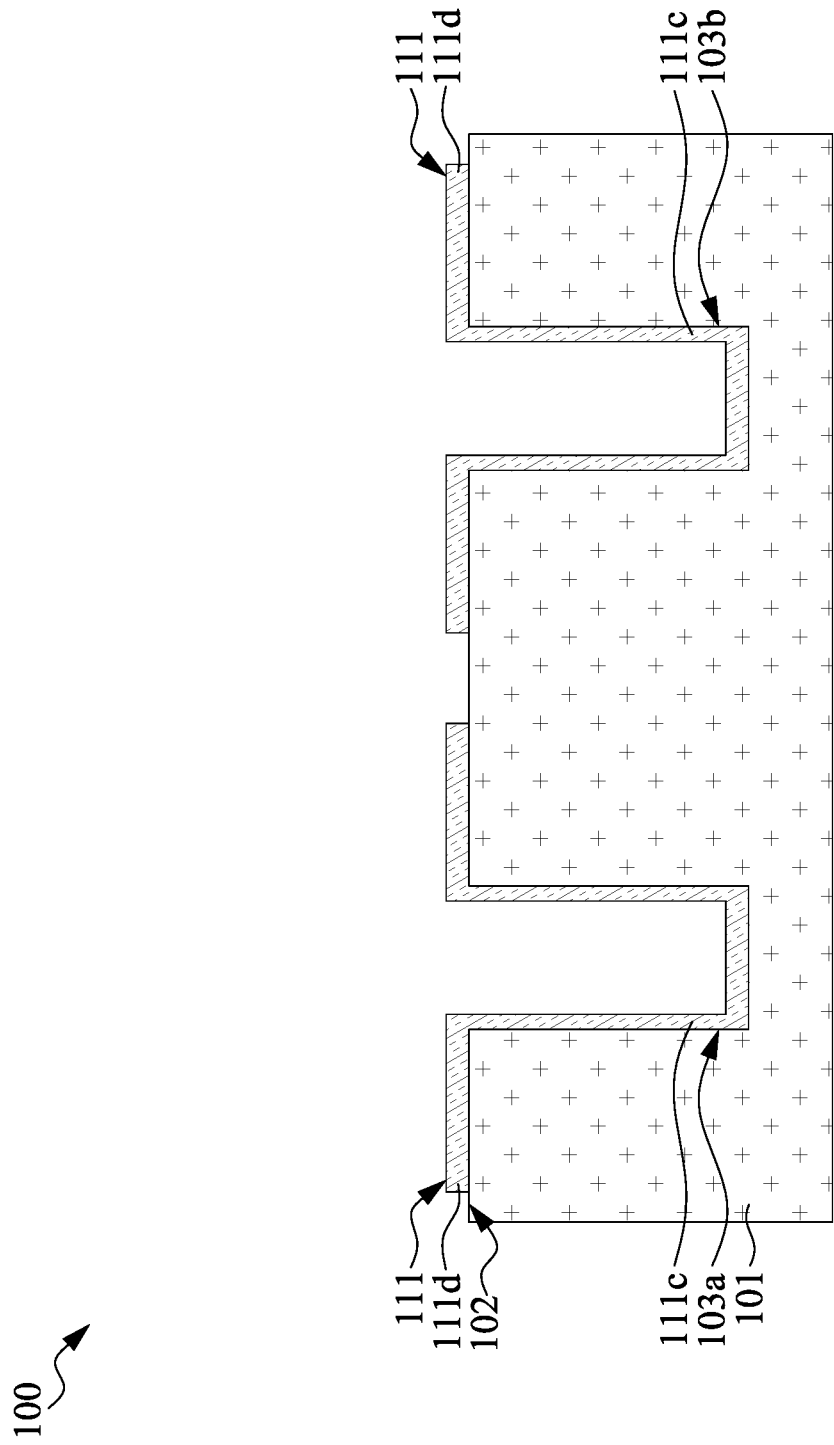

FIG. 10B illustrates a cross-sectional view of the semiconductor structure along line A-A' in FIG. 10A. In operation 502, referring to FIGS. 10A and 10B, a first isolation layer 111 is disposed on the surface 102 of the substrate 101 and extends into the recess (the first recess 103a or the second recess 103b). In some embodiments, each of the first recess 103a and the second recess 103b has a first isolation layer 111 formed therein. In some embodiments, the first isolation layer 111 has a configuration similar to those described above or illustrated in any one of FIGS. 1 to 7.

In some embodiments, each of the first isolation layers 111 is formed over the surface 102 of the substrate 101 and the recess (the first recess 103a and/or the second recess 103b). In some embodiments, each of the first isolation layers 111 is conformal to the recess (the first recess 103a and/or the second recess 103b) and a portion of the surface 102 of the substrate 101. The first isolation layer 111 may be deposited over the surface 102 of the substrate 101 and then planarized, such as by respective CMP processes. The first isolation layer 111 may be deposited by physical vapor deposition (PVD), CVD, sputter deposition, or another technique for depositing the selected material.

In some embodiments, a main portion 111c of the first isolation layer 111 is disposed in and conformal to the corresponding recess (the first recess 103a or the second recess 103b), and an extension portion 111d of the first isolation layer 111 is disposed on the surface 102 of the substrate 101 and in contact with the corresponding main portion 111c. In some embodiments, the main portion 111c of the first isolation layer 111 and the corresponding extension portion 111d of the corresponding first isolation layer 111 are formed continuously as a single object.

In some embodiments, the first isolation layer 111 formed within the first recess 103a and the first isolation layer 111 formed within the second recess 103b are disposed simultaneously or separately. In some embodiments, the first isolation layer 111 formed within the first recess 103a is separate from the first isolation layer 111 formed within the second recess 103b.

Figure 11A:
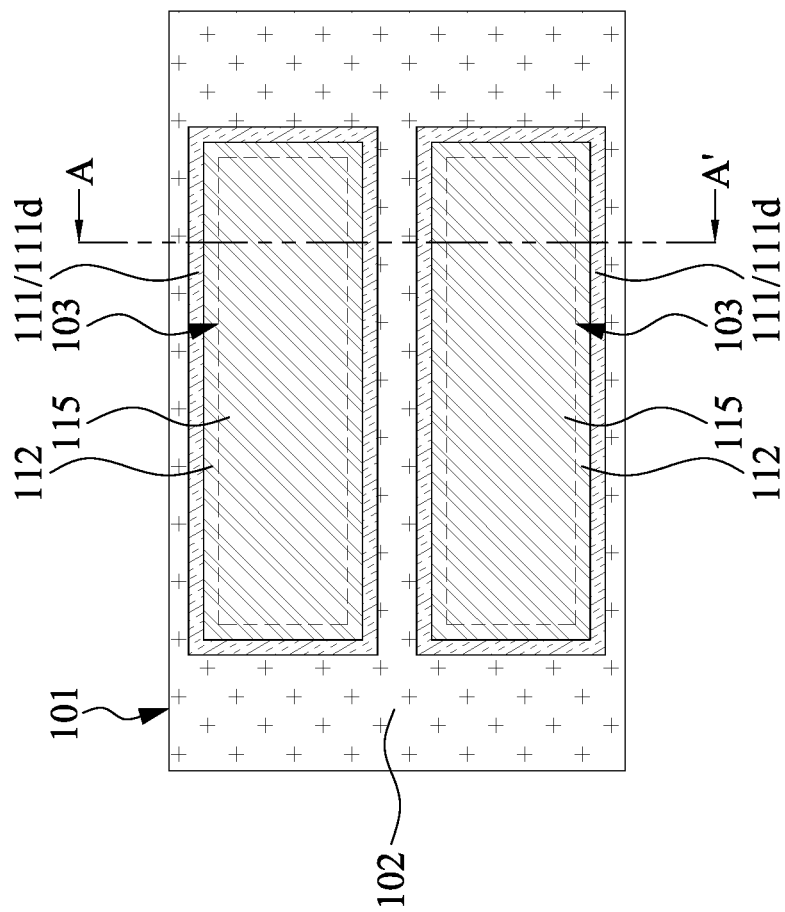
Figure 11B:
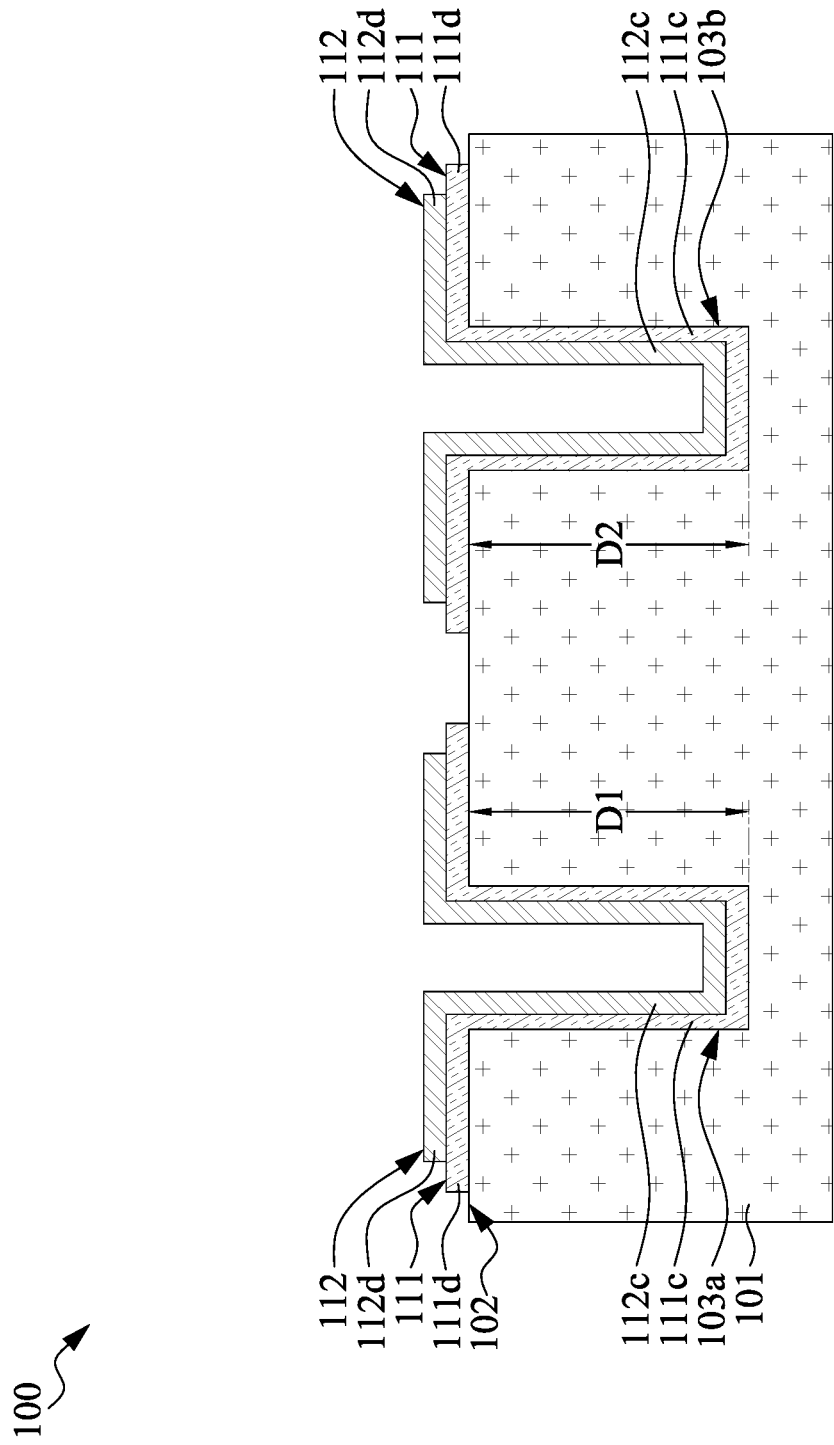

FIG. 11B illustrates a cross-sectional view of the semiconductor structure along line A-A' in FIG. 11A. In operation 503, referring to FIGS. 11A and 11B, a first magnetic layer 112 is disposed over the first isolation layer 111. In some embodiments, the first magnetic layers 112 are disposed over the first isolation layer 111 formed within the first recess 103a and the first isolation layer 111 formed within the second recess 103b. In some embodiments, at least a portion of the first magnetic layer 112 is disposed in the corresponding recess (the first recess 103a or the second recess 103b) and conformal to the corresponding first isolation layer 111. In some embodiments, a portion of the first isolation layer 111 is exposed by the corresponding first magnetic layer 112 after the disposing of the corresponding first magnetic layer 112. In some embodiments, the first magnetic layer 112 has a configuration similar to those described above or illustrated in any one of FIGS. 1 to 7.

In some embodiments, the first magnetic layer 112 is formed over the corresponding first isolation layer 111. The first magnetic layer 112 may be deposited over the corresponding first isolation layer 111. The first magnetic layer 112 may be deposited by PVD, CVD, sputter deposition, or another technique for depositing the selected material. In some embodiments, the first magnetic layer 112 disposed on the corresponding first isolation layer 111 forms a main portion 112c of the first magnetic layer 112 disposed on and conformal to the corresponding main portion 111c of the corresponding first isolation layer 111, and forms an extension portion 112d of the first magnetic layer 112 disposed on the extension portion 111d of the corresponding first isolation layer 111 and in contact with the corresponding main portion 112c of the corresponding first magnetic layer 112. In some embodiments, the main portion 112c of the first magnetic layer 112 and the corresponding extension portion 112d of the corresponding first magnetic layer 112 are formed continuously as a single object.

In some embodiments, the first magnetic layer 112 over the first recess 103a and the first magnetic layer 112 over the second recess 103b are formed simultaneously or separately. In some embodiments, the first magnetic layer 112 over the first recess 103a is separate from the first magnetic layer 112 over the second recess 103b.

Figure 12A:
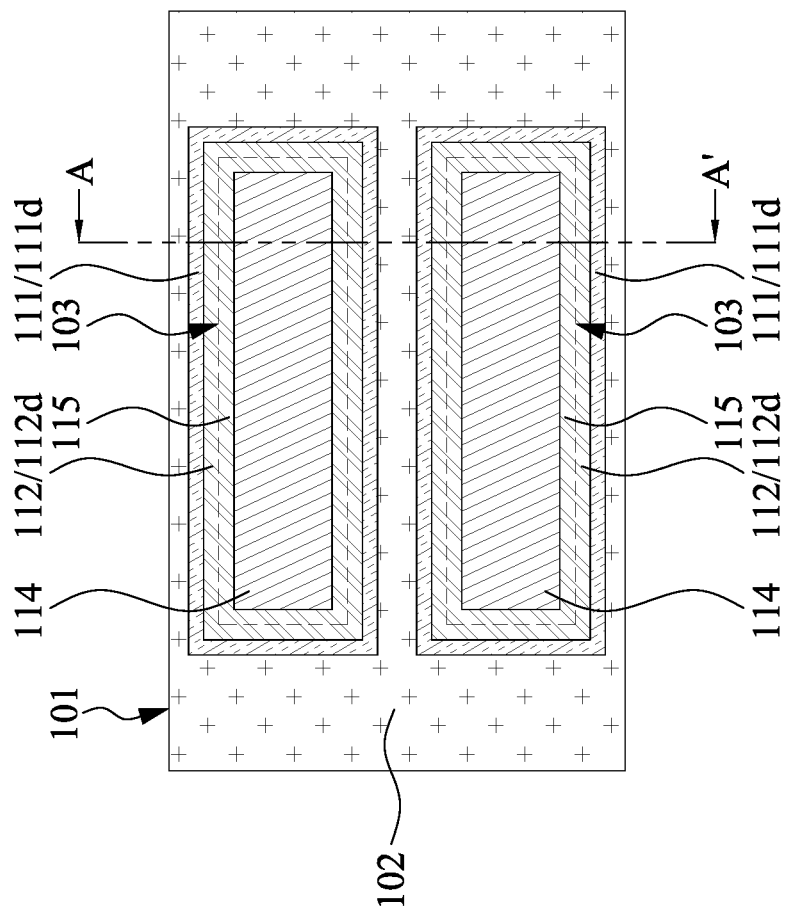
Figure 12B:
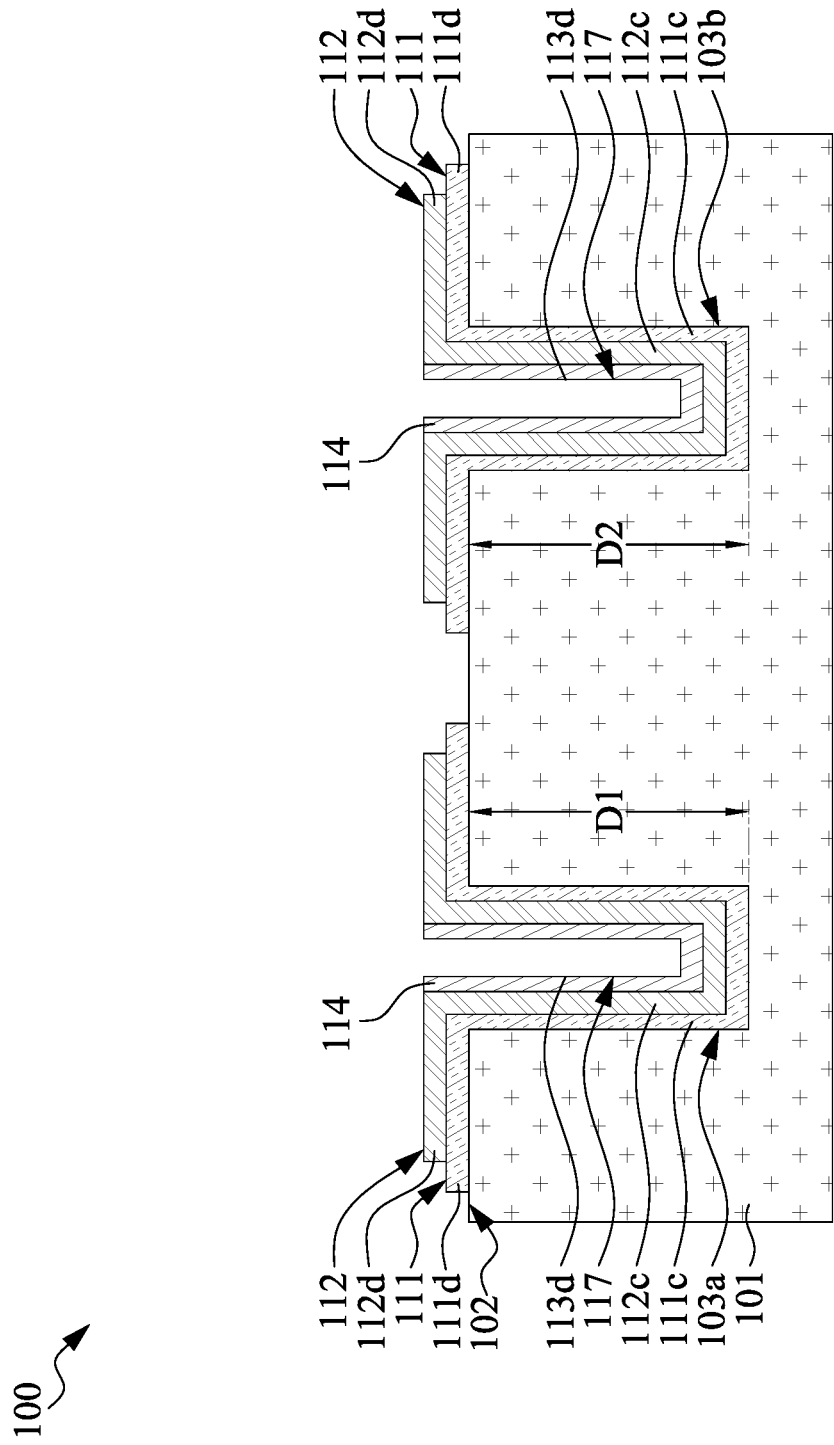

FIG. 12B illustrates a cross-sectional view of the semiconductor structure along line A-A' in FIG. 12A. In operation 504, referring to FIGS. 12A and 12B, a second isolation layer 114 is disposed over the first magnetic layer 112 to form a trench 117 defined by the second isolation layer 114.

In some embodiments, the second isolation layer 114 is formed with the recess (the first recess 103a or the second recess 103b) and disposed over the main portion 112c of the corresponding first magnetic layer 112. In some embodiments, each of the second isolation layers 114 is conformal to the corresponding main portion 112c of the corresponding first magnetic layer 112. In some embodiments, the second isolation layer 114 is surrounded by the corresponding main portion 112c of the corresponding first magnetic layer 112. In some embodiments, the trench 117 is defined by the second isolation layer 114. In some embodiments, at least a portion of the trench 117 is disposed within the corresponding first recess 103a or the corresponding second recess 103b. In some embodiments, the second isolation layer 114 has a configuration similar to those described above or illustrated in any one of FIGS. 1 to 7.

The second isolation layer 114 may be deposited over the corresponding first magnetic layer 112. The second isolation layer 114 may be deposited by PVD, CVD, sputter deposition, or another technique for depositing the selected material.

In some embodiments, the second isolation layer 114 over the first recess 103a and the second isolation layer 114 over the second recess 103b are formed simultaneously or separately. In some embodiments, the trench surrounded by the first recess 103a is substantially same as or different from the trench 117 surrounded by the second recess 103b. In some embodiments, the trench 117 surrounded by the first recess 103a and the trench 117 surrounded by the second recess 103b are formed simultaneously or separately.

Figure 13A:
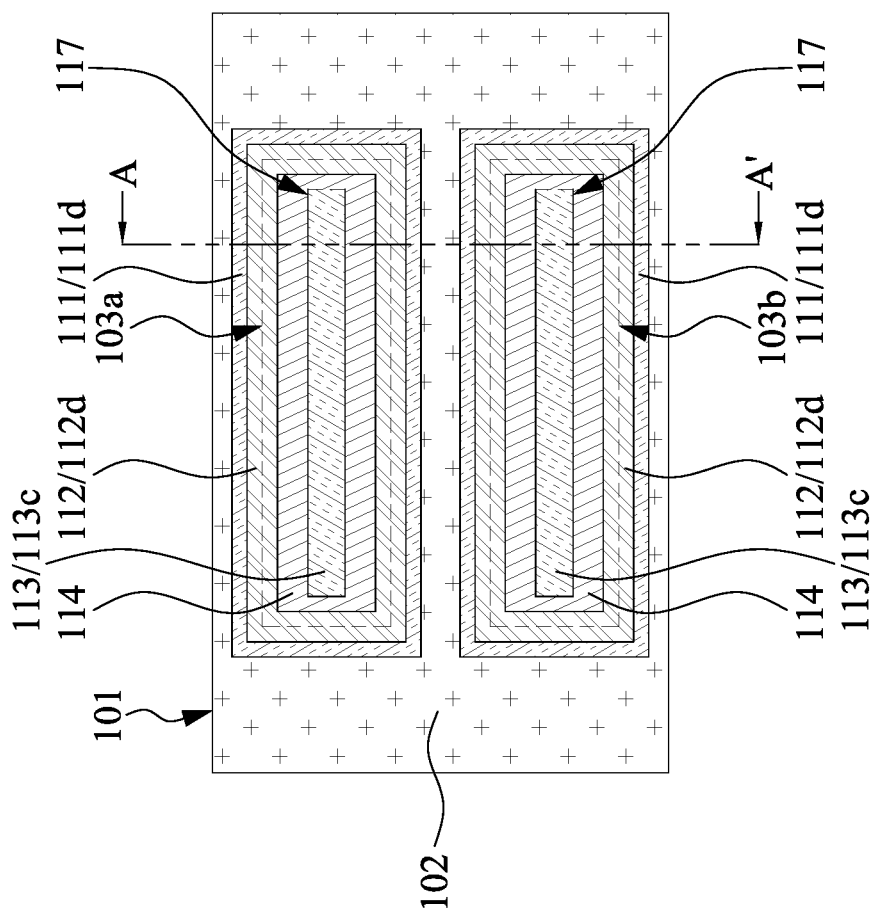
Figure 13B:
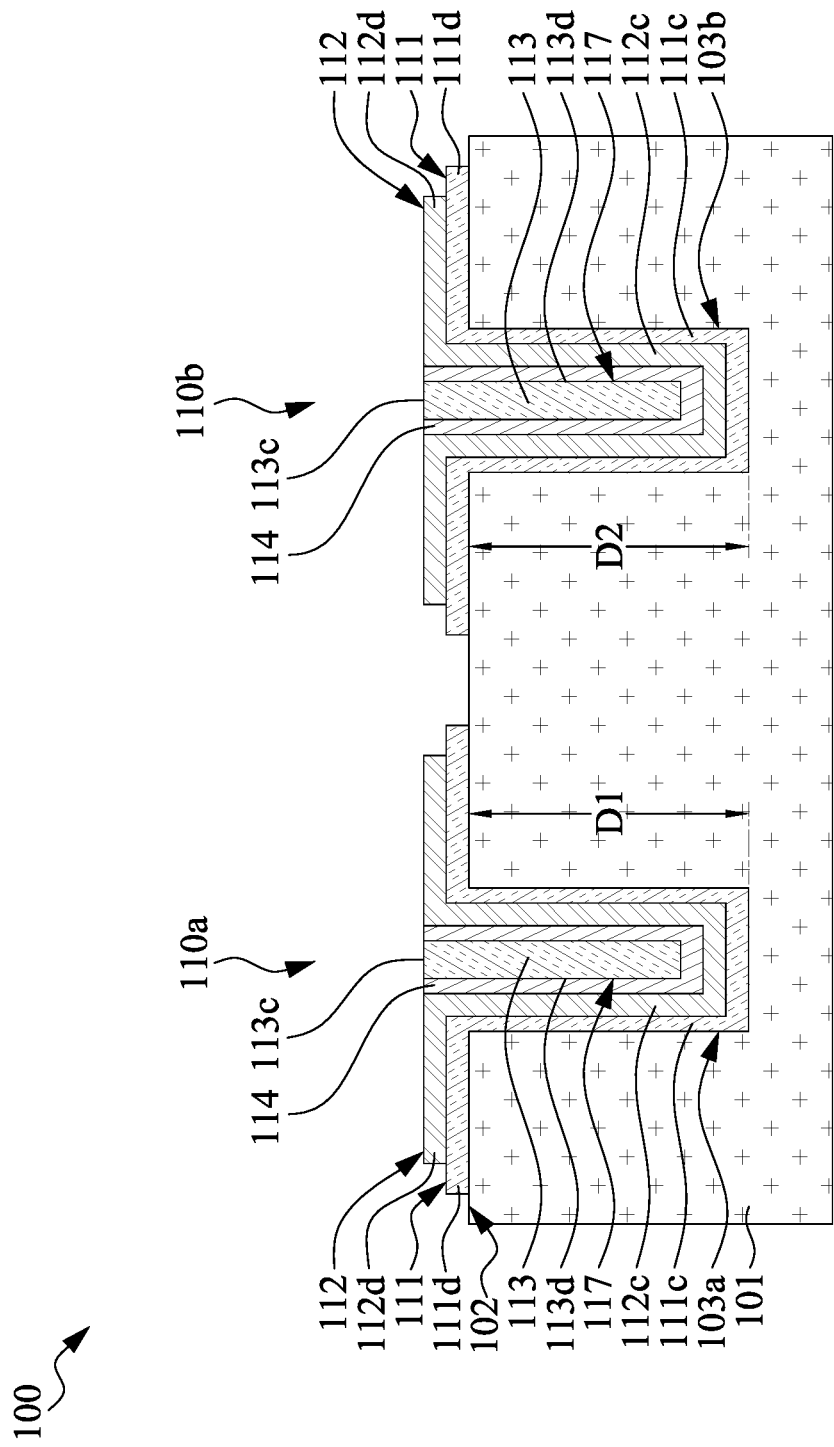

FIG. 13B illustrates a cross-sectional view of the semiconductor structure along line A-A' in FIG. 13A. In operation 505, referring to FIGS. 13A and 13B, a conductive element 113 is disposed in the trench 117. In some embodiments, each trench 117 has the conductive element 113 formed therein. In some embodiments, the conductive element 113 formed within the trench 117 is conformal to the corresponding second isolation layer 114. In some embodiments, the conductive element 113 has a configuration similar to those described above or illustrated in any one of FIGS. 1 to 7.

The conductive element 113 may be deposited in the corresponding trench 117. The conductive element 113 may be deposited by PVD, CVD, sputter deposition, or another technique for depositing the selected material.

In some embodiments, the conductive element 113 over the first recess 103a and the conductive element 113 over the second recess 103b are formed simultaneously or separately. In some embodiments, the conductive element 113 over the first recess 103a is substantially same as or different from the conductive element 113 over the second recess 103b. In some embodiments, excess conductive materials of the conductive element 113 are removed through a CMP or the like until a top surface 113c of the conductive element 113 is level with the corresponding extension portion 112d of the corresponding first magnetic layer 112 and the corresponding second isolation layer 114.

In some embodiments, the method 500 further includes electrically connecting the conductive element 113 to a bump pad (not shown). In some embodiments, the method 500 further includes forming a bridging member (not shown) over the conductive element 113 and electrically connecting the conductive element 113 to the bump pad through the bridging member.

Figure 14A:
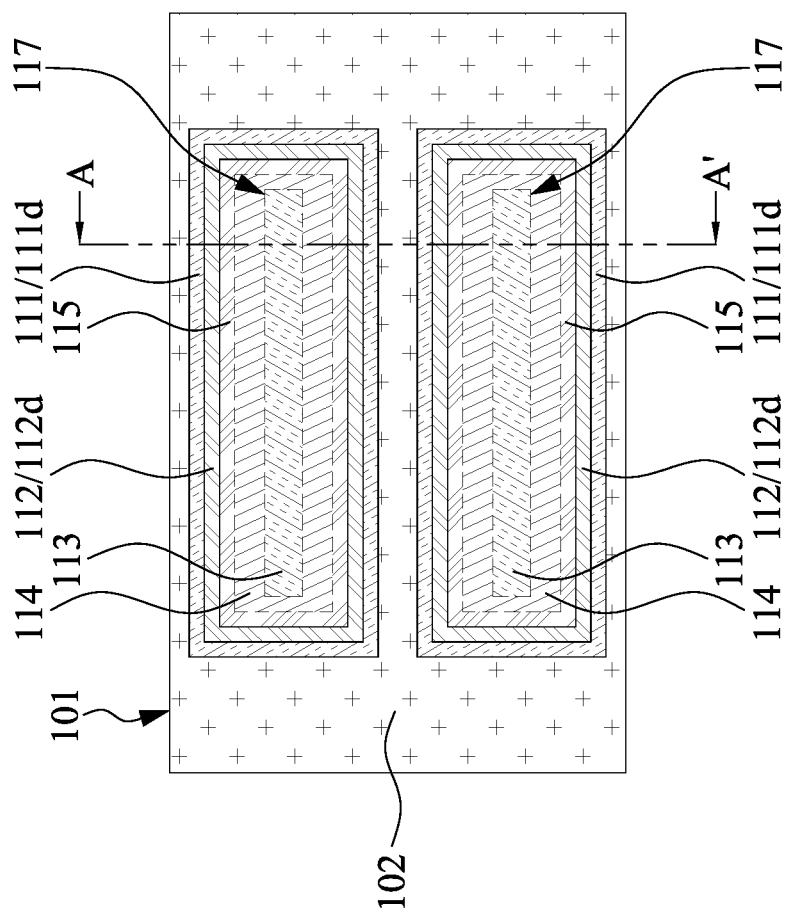
Figure 14B:
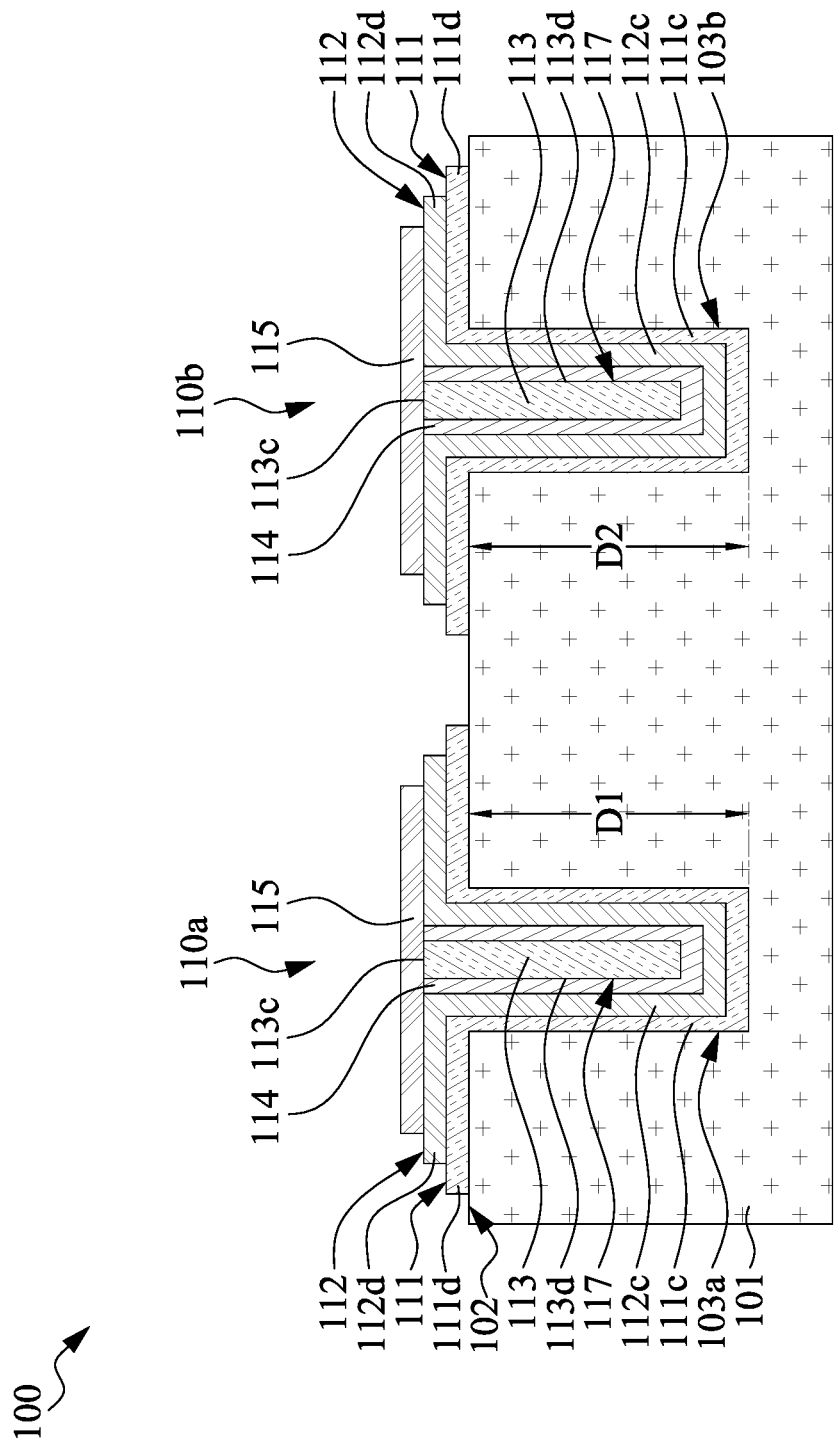

FIG. 14B illustrates a cross-sectional view of the semiconductor structure along line A-A' in FIG. 14A. In operation 506, referring to FIGS. 14A and 14B, a third isolation layer 115 is disposed over the first magnetic layer 112, the conductive element 113 and the second isolation layer 114. In some embodiments, each of the second isolation layers 114 has the third isolation layer 115 disposed thereover. In some embodiments, the third isolation layer 115 has a configuration similar to those described above or illustrated in any one of FIGS. 1 to 7.

In some embodiments, in operation 506, the third isolation layer 115 is disposed over the first magnetic layer 112, the corresponding conductive element 113 and the corresponding second isolation layer 114. In some embodiments, the third isolation layer 115 is in contact with the corresponding conductive element 113, the corresponding second isolation layer 114, and the corresponding first magnetic layer 112. In some embodiments, a portion of the first magnetic layer 112 is exposed by the corresponding third isolation layer 115 after the disposing of the corresponding second isolation layer 114. In some embodiments, the third isolation layer 115 is disposed on and conformal to the corresponding extension portion 112d of the corresponding first magnetic layer 112 and the top surface 113c of the corresponding conductive element 113. In some embodiments, the third isolation layer 115, the corresponding extension portion 112d of the corresponding first magnetic layer 112, and the corresponding extension portion 111d of the corresponding first isolation layer 111 form a step structure.

The third isolation layer 115 may be deposited by PVD, CVD, sputter deposition, or another technique for depositing the selected material. In some embodiments, the third isolation layer 115 over the first recess 103a and the third isolation layer 115 over the second recess 103b are formed simultaneously or separately.

Figure 15A:
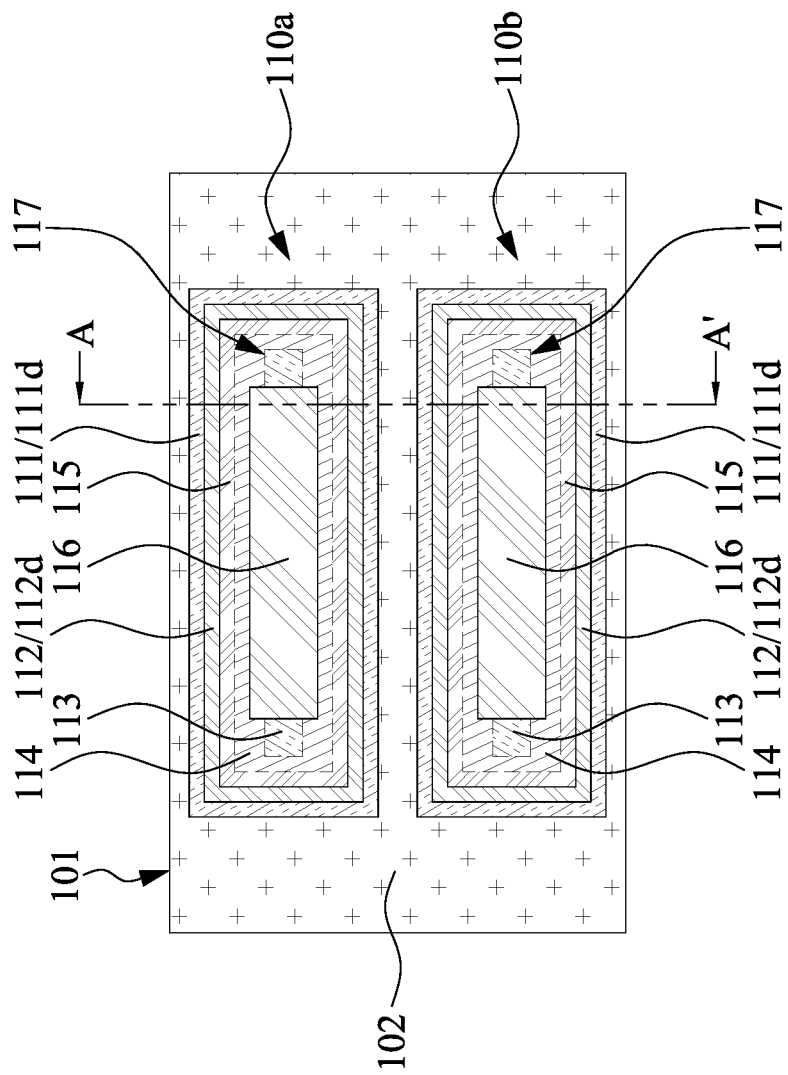
Figure 15B:
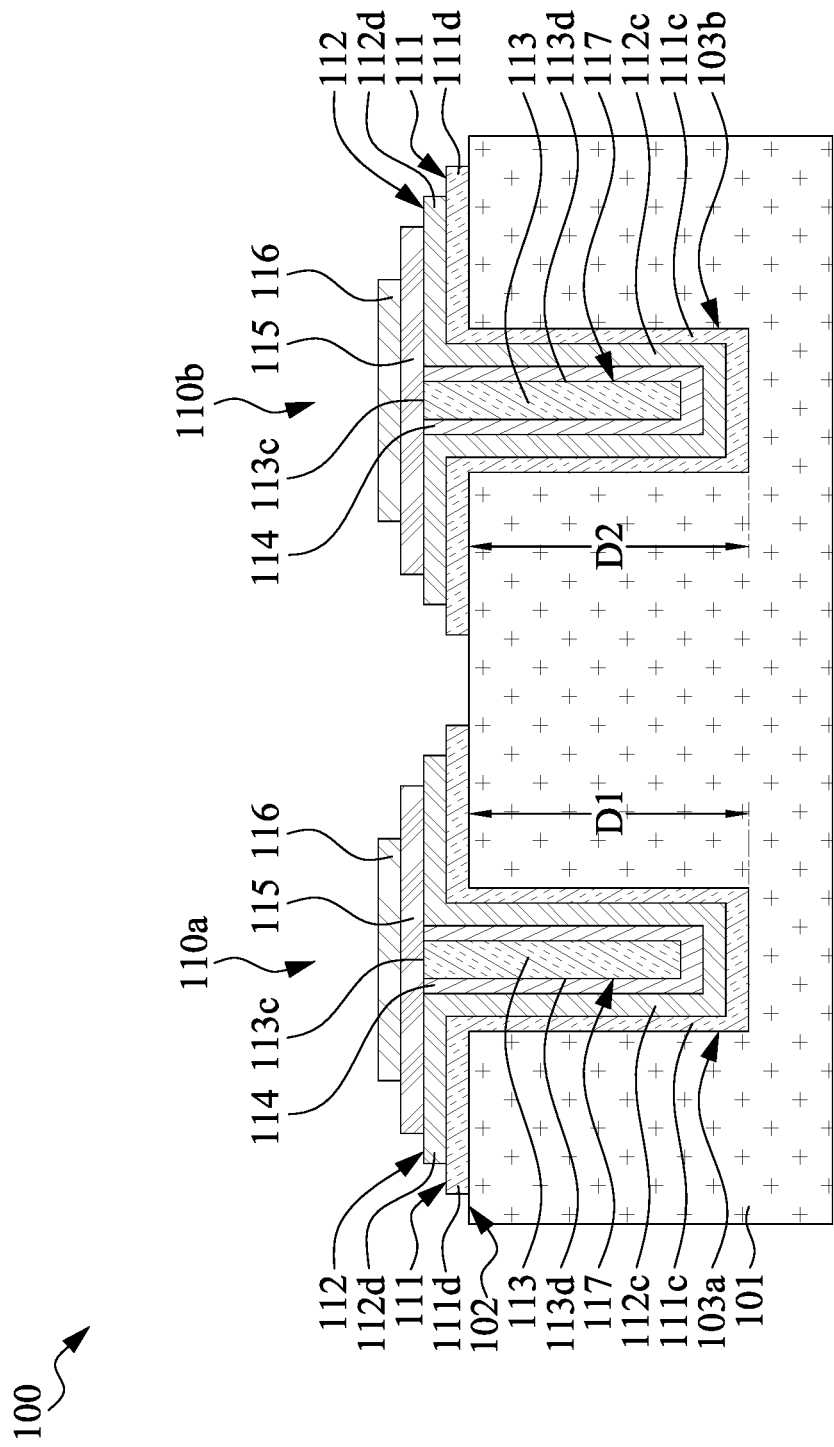

FIG. 15B illustrates a cross-sectional view of the semiconductor structure along line A-A' in FIG. 15A. In operation 507, referring to FIGS. 15A and 15B, a second magnetic layer 116 is disposed over the third isolation layer 115. In some embodiments, each of the third isolation layers 115 has the second magnetic layer 116 disposed thereon. In some embodiments, a first inductor device 110a and a second inductor device 110b adjacent to the first inductor device 110a are formed. In some embodiments, the second magnetic layer 116 has a configuration similar to those described above or illustrated in any one of FIGS. 1 to 7.

In some embodiments, in operation 507, the second magnetic layer 116 covers a portion of the corresponding third isolation layer 115. In some embodiments, the second magnetic layer 116 is in contact with the corresponding third isolation layer 115. In some embodiments, only a portion of the corresponding conductive element 113 is overlapped from a top view perspective by the corresponding second magnetic layer 116 after the disposing of the corresponding second magnetic layer 116. In some embodiments, the second magnetic layer 116 is conformal to the corresponding third isolation layer 115. In some embodiments, the second magnetic layer 116, the corresponding third isolation layer 115, the corresponding extension portion 112d of the corresponding first magnetic layer 112, and the corresponding extension portion 111d of the corresponding first isolation layer 111 form a step structure.

The second magnetic layer 116 may be deposited by PVD, CVD, sputter deposition, or another technique for depositing the selected material. In some embodiments, the second magnetic layer 116 over the first recess 103a and the second magnetic layer 116 over the second recess 103b are formed simultaneously or separately.

Some embodiments of the present disclosure provide semiconductor structure including a substrate comprising a surface; a recess extending into the substrate from the surface of the substrate; and an inductor device including a first isolation layer, a first magnetic layer over the first isolation layer, a second isolation layer over the first magnetic layer, and a conductive element surrounded by the second isolation layer, wherein at least a portion of the inductor device is disposed within the recess.

In some embodiments, the first isolation layer is disposed within the recess and conformal to the recess, and the first magnetic layer is conformal to the first isolation layer. In some embodiments, the inductor device further includes a third isolation layer disposed over the second isolation layer and the conductive element, and a second magnetic layer disposed over the third isolation layer. In some embodiments, the second isolation layer is disposed between the conductive element and the first magnetic layer. In some embodiments, at least a portion of the conductive element is disposed within the recess. In some embodiments, the third isolation layer is disposed over the conductive element and the second magnetic layer. In some embodiments, the first isolation layer includes a main portion disposed within the recess and an extension portion attached to the first portion and disposed on the surface of the substrate. In some embodiments, a top surface of the conductive element is level with the first magnetic layer. In some embodiments, the third isolation layer and the second magnetic layer are disposed over the substrate, and the third isolation layer covers the conductive element and the second isolation layer. In some embodiments, a portion of the third isolation layer is exposed by the second magnetic layer.

Some embodiments of the present disclosure provide a semiconductor structure including a substrate having a first recess and a second recess adjacent to the first recess; a first inductor device; a second inductor device adjacent to the first inductor device; and a bridging member disposed between and electrically connected to the first inductor device and the second inductor device, wherein the first inductor device includes a first isolation layer conformal to the first recess, a first magnetic layer over the first isolation layer and a first conductive element within the first recess and surrounded by the first magnetic layer; wherein the second inductor device includes a second isolation layer conformal to the second recess, a second magnetic layer over the second isolation layer and a second conductive element within the second recess and surrounded by the second magnetic layer, wherein the bridging member couples the first conductive element to the second conductive element.

In some embodiments, a depth of the first recess or a depth of the second recess is between 10 and 20 μm. In some embodiments, the bridging member is at least partially covered by a third isolation layer on the first magnetic layer, and the bridging member is at least partially covered by a fourth isolation layer on the second magnetic layer. In some embodiments, the semiconductor structure further includes a bump pad disposed adjacent to the first inductor device or the second inductor device and electrically coupled to the bridging member.

A method of manufacturing a semiconductor structure includes forming a recess on a surface of a substrate; disposing a first isolation layer on the surface and extending into the recess; disposing a first magnetic layer over the first isolation layer; disposing a second isolation layer over the first magnetic layer to form a trench defined by the second isolation layer; disposing a conductive element in the trench; disposing a third isolation layer over the first magnetic layer, the conductive element and the second isolation layer; and disposing a second magnetic layer over the third isolation layer.

In some embodiments, a portion of the first isolation layer is exposed by the first magnetic layer after the disposing of the first magnetic layer. In some embodiments, the third isolation layer is in contact with the conductive element, the second isolation layer and the first magnetic layer. In some embodiments, the first isolation layer is conformal to the recess and a portion of the surface of the substrate. In some embodiments, the first magnetic layer is conformal to the first isolation layer. In some embodiments, the method further includes electrically connecting the conductive element to a bump pad.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate including a surface;
    a recess extending into the substrate from the surface of the substrate; and
    an inductor device including a first isolation layer, a first magnetic layer over the first isolation layer, a second isolation layer over the first magnetic layer, a conductive element surrounded by the second isolation layer, and a third isolation layer disposed over the second isolation layer and the conductive element, and a second magnetic layer disposed over the third isolation layer,
    wherein at least a portion of the inductor device is disposed within the recess, and a portion of the third isolation layer is exposed by the second magnetic layer.

2. The semiconductor structure of claim 1, wherein the first isolation layer is disposed within the recess and conformal to the recess, and the first magnetic layer is conformal to the first isolation layer.

3. The semiconductor structure of claim 1, wherein at least a portion of the first magnetic layer is disposed within the recess.

4. The semiconductor structure of claim 1, wherein the second isolation layer is disposed between the conductive element and the first magnetic layer.

5. The semiconductor structure of claim 1, wherein at least a portion of the conductive element is disposed within the recess.

6. The semiconductor structure of claim 1, wherein the third isolation layer is disposed over the conductive element and the first magnetic layer.

7. The semiconductor structure of claim 1, wherein the first isolation layer includes a main portion disposed within the recess and an extension portion attached to the main portion and disposed on the surface of the substrate.

8. The semiconductor structure of claim 1, wherein a top surface of the conductive element is level with the first magnetic layer.

9. The semiconductor structure of claim 3, wherein the third isolation layer and the second magnetic layer are disposed over the substrate, and the third isolation layer covers the conductive element and the second isolation layer.

10. The semiconductor structure of claim 1, wherein the third isolation layer contacts the second isolation layer.

11. A semiconductor structure, comprising:
a substrate having a first recess on a surface and a second recess adjacent to the first recess;
a first inductor device; and
a second inductor device adjacent to the first inductor device and electrically connected to the first inductor device;
wherein the first inductor device includes a first isolation layer conformal to the first recess, a first magnetic layer over the first isolation layer, a second isolation layer over the first magnetic layer, and a first conductive element within the first recess and surrounded by the first magnetic layer and the second isolation layer,
wherein the second inductor device includes a third isolation layer conformal to the second recess, a second magnetic layer over the third isolation layer, a fourth isolation layer over the second magnetic layer, and a second conductive element within the second recess and surrounded by the second magnetic layer and the fourth isolation layer,
the first isolation layer includes a main portion disposed within the first recess and an extension portion attached to the main portion and disposed on the surface of the substrate, and a dielectric layer surrounds the extension portion of the first isolation layer.

12. The semiconductor structure of claim 11, wherein a depth of the first inductor device or a depth of the second inductor device is between 10 and 20 μm.

13. The semiconductor structure of claim 11, wherein a portion of the first isolation layer is exposed by the first magnetic layer.

14. The semiconductor structure of claim 11, wherein the first isolation layer of the first inductor device is spaced apart from the third isolation layer of the second inductor device.

15. The semiconductor structure of claim 11, wherein the dielectric layer is disposed over the first recess and the second recess.

16. A semiconductor structure, comprising:
a substrate including a surface; and
an inductor device extending into the substrate from the surface of the substrate and including a first isolation layer, a first magnetic layer over the first isolation layer, a second isolation layer over the first magnetic layer, and a conductive element surrounded by the second isolation layer, and a third isolation layer disposed over the second isolation layer and the conductive element, and a second magnetic layer disposed over the third isolation layer,
wherein at least a portion of the first isolation layer and at least a portion of the first magnetic layer are disposed within the substrate, the first isolation layer and the first magnetic layer form a step structure over the surface of the substrate, and a portion of the third isolation layer is exposed by the second magnetic layer.

17. The semiconductor structure of claim 16, wherein the first isolation layer is conformal to a portion of the surface of the substrate.

18. The semiconductor structure of claim 16, wherein the first isolation layer includes a main portion extending into the substrate and an extension portion attached to the main portion, disposed on the surface of the substrate and at least partially exposed by the first magnetic layer.

19. The method of claim 16, wherein the third isolation layer is in contact with the conductive element, the second isolation layer and the first magnetic layer.

20. The method of claim 16, wherein the first isolation layer, the first magnetic layer, the third isolation layer, and the second magnetic layer form the step structure over the substrate.

* * * * *